US007563986B2

(12) United States Patent
Shitamura

(10) Patent No.: US 7,563,986 B2
(45) Date of Patent: Jul. 21, 2009

(54) MULTIPLE FLEXIBLE WIRING BOARD, METHOD FOR PRODUCING SAME, METHOD FOR PRODUCING FLEXIBLE WIRING BOARD, AND FLEXIBLE WIRING BOARD

(75) Inventor: Hironobu Shitamura, Hiroshima (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 97 days.

(21) Appl. No.: 11/599,369

(22) Filed: Nov. 15, 2006

(65) Prior Publication Data

US 2007/0111559 A1    May 17, 2007

(30) Foreign Application Priority Data

Nov. 16, 2005    (JP) .............................. 2005-331867

(51) Int. Cl.
*H05K 1/00*    (2006.01)
(52) U.S. Cl. ....................................... 174/254; 174/268
(58) Field of Classification Search ................. 174/254, 174/257, 268
See application file for complete search history.

(56) References Cited

U.S. PATENT DOCUMENTS 5,516,989 A * 5/1996 Uedo et al. .................. 174/254
6,891,108 B2 * 5/2005 Prindiville et al. .......... 174/255
7,081,590 B2 * 7/2006 Yuzawa ...................... 174/250

FOREIGN PATENT DOCUMENTS

JP        6-283849 A      10/1994

* cited by examiner

*Primary Examiner*—Ishwar (I. B.) Patel
(74) *Attorney, Agent, or Firm*—Birch, Stewart, Kolasch & Birch, LLP

(57) ABSTRACT

One embodiment of a multiple flexible wiring board is a multiple flexible wiring board in which a plurality of flexible wiring boards are configured, and in which a first wiring base material, a first covering film layer, a second wiring base material, a second covering film layer, and an adhesive sheet that bonds the first wiring base material and the second wiring base material such that the first covering film layer and the second covering film layer are opposed, and has opening portions that have been formed corresponding to each of the plurality of flexible wiring boards, are layered. A hollow portion of each of the flexible wiring boards is formed between the first wiring base material and the second wiring base material by the opening portions, and auxiliary opening portions are formed alongside the opening portions.

4 Claims, 17 Drawing Sheets

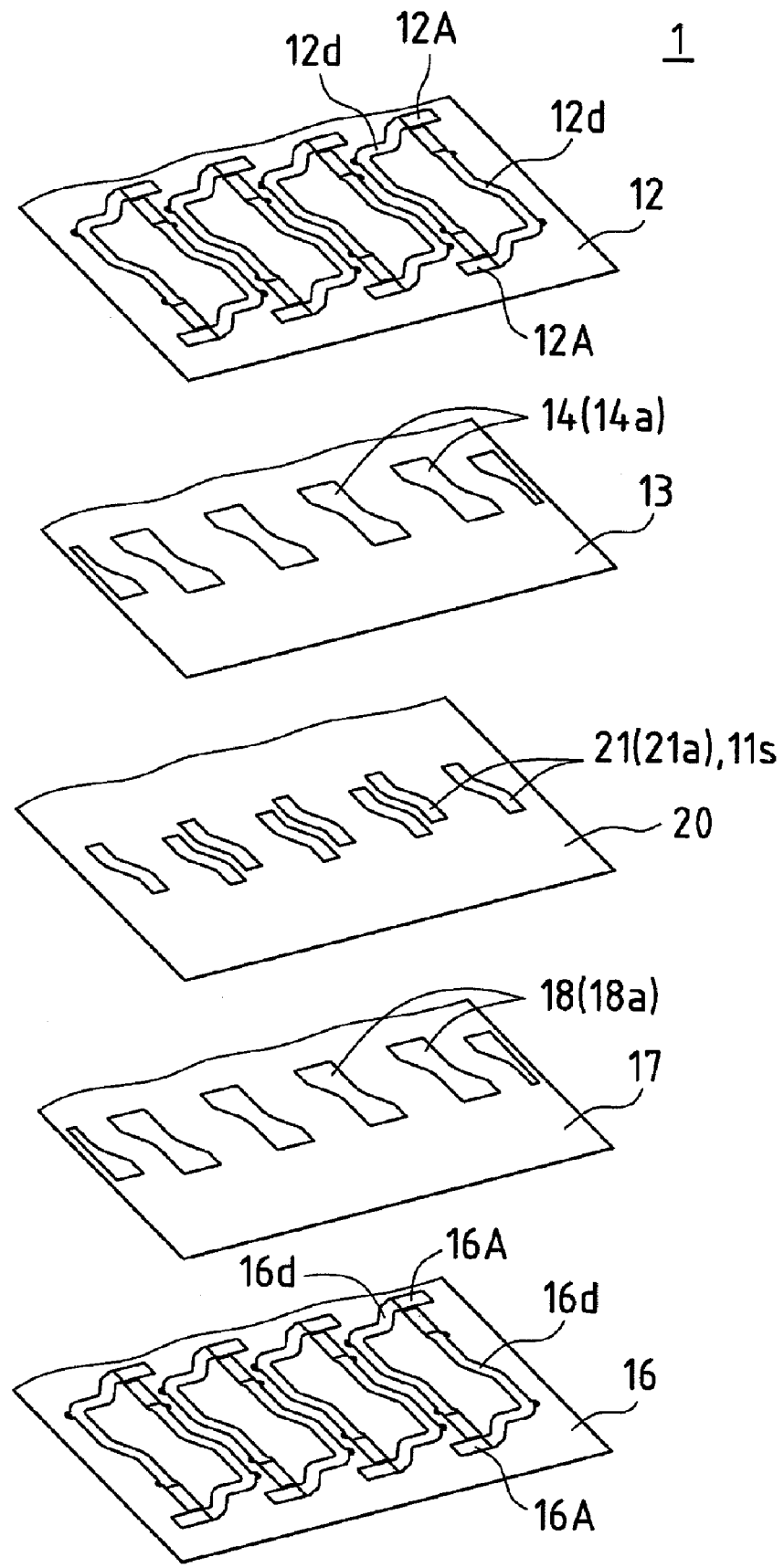

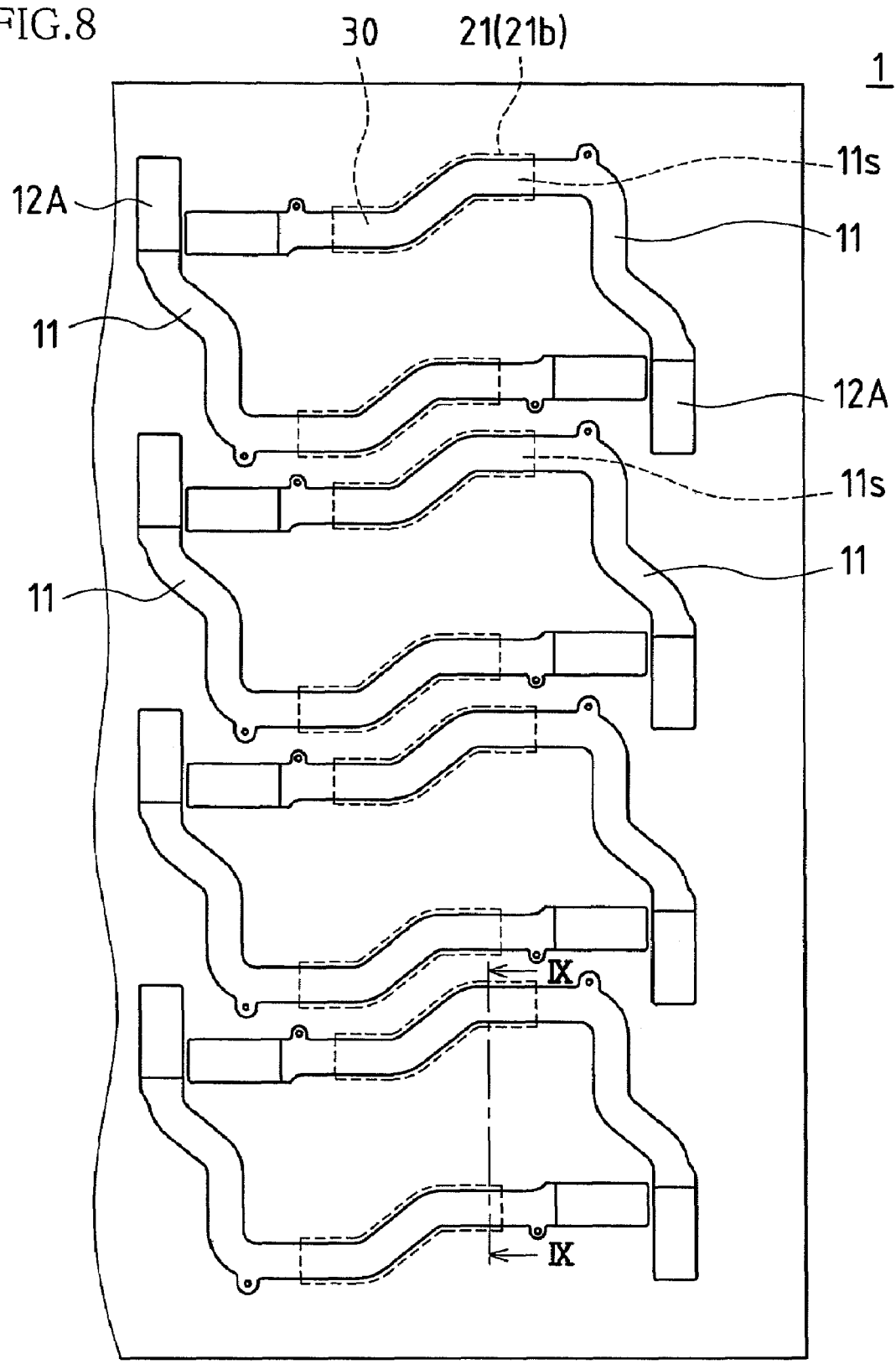

MULTIPLE FLEXIBLE WIRING BOARD, METHOD FOR PRODUCING SAME, METHOD FOR PRODUCING FLEXIBLE WIRING BOARD, AND FLEXIBLE WIRING BOARD

CROSS REFERENCE TO RELATED APPLICATIONS

This application claims priority under 35 U.S.C. § 119(a) on Japanese Patent Application No. 2005-331867 filed in Japan on Nov. 16, 2005, the entire contents of which are hereby incorporated by reference.

BACKGROUND OF THE INVENTION

1. Field of Invention

The present invention relates to a multiple flexible wiring board in which a plurality of flexible wiring boards having bendability are arranged dispersed, a method for producing that multiple flexible wiring board, a method for producing a flexible wiring board, and that flexible wiring board.

2. Related Art

A multiple flexible wiring board, a method for producing that multiple flexible wiring board, and a flexible wiring board according to a conventional example will be described with reference to FIGS. 14 to 17.

FIG. 14 is an exploded perspective view of a multiple flexible wiring board according to a conventional example. FIG. 15 is a plan view of the multiple flexible wiring board according to the conventional example. FIGS. 16(A) and 16(B) are cross-sectional diagrams that show the broken cross-section at arrow XVI in FIG. 15. FIG. 16(A) shows a layered state in a temporary fastening step prior to thermocompression bonding, and FIG. 16(B) shows a layered state after thermocompression bonding with a pressure bonding step. FIGS. 17(A) to 17(C) are explanatory diagrams that explain a flexible wiring board according to the conventional example. FIG. 17(A) is a plan view, FIG. 17(B) is a side view, and FIG. 17(C) is a side view that shows a state of use.

A multiple flexible wiring board 101 is configured by layering, in this arrangement, a first wiring base material 112, a first covering film layer 113 that covers one face of the first wiring base material 112, an adhesive sheet 120 that bonds the first wiring base material 112 and a second wiring base material 116 to each other in a layered state such that they face the first covering film layer 113 and a second covering film layer 117, the second covering film layer 117 that covers one face of the second wiring base material 116, and the second wiring base material 116.

The first wiring base material 112, the first covering film layer 113, the adhesive sheet 20, the second covering film layer 17, and the second wiring base material 16 are temporarily fastened in an aligned and layered state (a temporary fastening step), and with thermocompression bonding that applies heat and pressure from both faces of the first wiring base material 12 and the second wiring base material 16, the first wiring base material 112 and the second wiring base material 116 are bonded with interposition of the adhesive sheet 120 (a pressure bonding step).

The first wiring base material 112 and the second wiring base material 116 each have an insulation layer and a conductor pattern (not shown), and have flexible wiring board corresponding portions 112d and flexible wiring board corresponding portions 116d as areas that correspond to separate flexible wiring boards 111. The insulation layer of the first wiring base material 112 and the second wiring base material 116 has flexibility, and the conductor pattern is formed appropriately on one face or both faces of the insulation layer.

A plurality of the flexible wiring board corresponding portions 112d and the flexible wiring board corresponding portions 116d are formed and arranged on the multiple flexible wiring board 101, and it is possible to form a large number of flexible wiring boards 111 in a single processing step. Here, a state is shown in which by arranging the flexible wiring board corresponding portions 112d (the flexible wiring board corresponding portions 116d) in a plane such that they are symmetrically opposed, the area usage ratio is improved, and by further arranging the flexible wiring board corresponding portions 112d (the flexible wiring board corresponding portions 116d) in four rows, a total of eight flexible wiring boards 11 are formed together.

In the adhesive sheet 120, an opening portion 121 (for the convenience of this description, the opening portion prior to thermocompression bonding may be indicated as an opening portion 121a, and the opening portion after thermocompression bonding may be indicated as an opening portion 121b) is formed in order to form a hollow portion 111s after layering. Excess adhesive of the adhesive sheet 120 is melted due to the application of heat and pressure by the thermocompression bonding step and flows into the opening portion 121, forming an adhesive outflow portion 120f. Accordingly, the opening portion 121b is influenced by the adhesive outflow portion 120f and thus is smaller than the opening portion 121a.

After thermocompression bonding, the multiple flexible wiring board 101 is separated (a separation step) by pressing (cut-shaping) with a metal die of a predetermined shape that corresponds to the flexible wiring boards 111, thus forming a plurality of the flexible wiring boards 111 at the same time.

However, with respect to the separate flexible wiring boards 111, the adhesive outflow portion 120f may be formed in the hollow portion 111s, and a completely hollow state does not occur, so sometimes it is not possible to surely maintain flexibility. For example, a usage state in which those portions have been bent is shown in FIG. 17(C), but in some cases they will not be bent with a smooth curve as shown, or damaged. That is, there is the problem of having a serious effect on bendability, and in some cases the flexible wiring boards 111 will have low reliability.

In order to address such problems, it has been proposed to semi-harden the adhesive sheet 120 in advance, and furthermore adjust conditions such as the temperature and pressure when thermocompression bonding, and the melt viscosity of the adhesive (for example, see JP H6-283849A). However, with this method, it is difficult to set conditions, so adjustment is difficult, and thus solving the problems is difficult.

SUMMARY OF THE INVENTION

It is an object of the present invention to provide a multiple flexible wiring board that has, due to preventing excess melted adhesive from flowing out into opening portions, hollow portions in which adhesive outflow portions are not present, and to provide a flexible wiring board that is produced with the multiple flexible wiring board.

It is another object of the present invention to provide a method for producing a multiple flexible wiring board that has hollow portions in which, by preventing outflow of melted excess adhesive into opening portions during thermocompression bonding, adhesive outflow portions are not present, and a method for producing a flexible wiring board.

The multiple flexible wiring board according to the present invention is a multiple flexible wiring board in which a plurality of flexible wiring boards are configured, the multiple flexible wiring board including a first wiring base material having an insulation layer and a conductor pattern, a first covering film layer that covers one face of the first wiring base material, a second wiring base material having an insulation layer and a conductor pattern, a second covering film layer that covers one face of the second wiring base material, and an adhesive sheet that bonds the first wiring base material and the second wiring base material in a layered state such that the first covering film layer and the second covering film layer are opposed, and has opening portions that have been formed corresponding to each of the plurality of flexible wiring boards; in which a hollow portion for each of the plurality of flexible wiring boards is formed between the first wiring base material and the second wiring base material by the opening portions, and auxiliary opening portions are formed between the flexible wiring boards alongside the opening portions.

With this configuration, it is possible to contain excess adhesive with the auxiliary opening portions, so outflow of adhesive from the adhesive sheet into the opening portions (hollow portions) can be suppressed, and it is possible to configure a multiple flexible wiring board (flexible wiring board) provided with hollow portions in which there is not outflow of adhesive. Thus, an effect is exhibited that it is possible to realize a flexible wiring board that has excellent bendability and high reliability without increasing the number of components.

In the multiple flexible wiring board according to the present invention, the auxiliary opening portions may be formed in the adhesive sheet.

With this configuration, it is possible to contain excess adhesive with the auxiliary opening portions formed in the adhesive sheet, so outflow of adhesive from the adhesive sheet into the hollow portions can be suppressed, and it is possible for there to be no outflow of adhesive in the hollow portions.

In the multiple flexible wiring board according to the present invention, the auxiliary opening portions may be formed in at least either one of the first covering film layer and the second covering film layer.

With this configuration, it is possible to contain excess adhesive with the auxiliary opening portions formed in the first covering film layer and/or the second covering film layer, so outflow of adhesive from the adhesive sheet into the hollow portions can be suppressed, and it is possible for there to be no outflow of adhesive in the hollow portions.

In the multiple flexible wiring board according to the present invention, at least either one of a conductor layer that corresponds to the conductor pattern of the first wiring base material and a conductor layer that corresponds to the conductor pattern of the second wiring base material that are each formed on the side of the adhesive sheet may be removed at positions that correspond to the auxiliary opening portions.

With this configuration, it is possible to contain excess adhesive corresponding to the thickness of the conductor layer at positions corresponding to the auxiliary opening portions, so outflow of adhesive from the adhesive sheet into the hollow portions can be suppressed, and it is possible for there to be no outflow of adhesive in the hollow portions.

The method for producing a multiple flexible wiring board according to the present invention is a method for producing a multiple flexible wiring board in which a plurality of flexible wiring boards are configured, the method including a temporary fastening step of layering and temporarily fastening a first wiring base material having an insulation layer and a conductor pattern, a first covering film layer that covers one face of the first wiring base material, a second wiring base material having an insulation layer and a conductor pattern, a second covering film layer that covers one face of the second wiring base material, and an adhesive sheet for bonding the first wiring base material and the second wiring base material such that the first covering film layer and the second covering film layer are opposed; and a pressure bonding step of bonding the first wiring base material and the second wiring base material by thermocompression bonding after the temporary fastening; and an opening portion formation step of forming opening portions in the adhesive sheet corresponding to each of the plurality of flexible wiring boards in order to form a hollow portion for each of the plurality of flexible wiring boards between the first wiring base material and the second wiring base material before the temporary fastening step; and an auxiliary opening portion formation step of forming auxiliary opening portions between the flexible wiring boards alongside the opening portions.

With this configuration, the same operation as the multiple flexible wiring board is obtained.

In the method for producing a multiple flexible wiring board according to the present invention, the auxiliary opening portions may be formed in the adhesive sheet.

With this configuration, the same operation as the multiple flexible wiring board is obtained.

In the method for producing a multiple flexible wiring board according to the present invention, the auxiliary opening portions may be formed in at least either one of the first covering film layer and the second covering film layer.

With this configuration, the same operation as the multiple flexible wiring board is obtained.

In the method for producing a multiple flexible wiring board according to the present invention, at least either one of a conductor layer that corresponds to the conductor pattern of the first wiring base material and a conductor layer that corresponds to the conductor pattern of the second wiring base material that are each formed on the side of the adhesive sheet may be removed at positions that correspond to the auxiliary opening portions.

With this configuration, the same operation as the multiple flexible wiring board is obtained.

Alternatively, the method for producing a multiple flexible wiring board according to the present invention is a method for producing a multiple flexible wiring board in which a plurality of flexible wiring boards are configured, the method including a temporary fastening step of layering and temporarily fastening a first wiring base material having an insulation layer and a conductor pattern, a first covering film layer that covers one face of the first wiring base material, a second wiring base material having an insulation layer and a conductor pattern, a second covering film layer that covers one face of the second wiring base material, and an adhesive sheet for bonding the first wiring base material and the second wiring base material such that the first covering film layer and the second covering film layer are opposed; and a pressure bonding step of bonding the first wiring base material and the second wiring base material by thermocompression bonding after the temporary fastening; and an opening portion formation step of forming opening portions in the adhesive sheet corresponding to each of the plurality of flexible wiring boards in order to form a hollow portion for each of the plurality of flexible wiring boards between the first wiring base material and the second wiring base material before the temporary fastening step; and a spacer embedding step of embedding spacers in the opening portions.

With this configuration, because the opening portions are embedded with spacers in advance, outflow of adhesive from the adhesive sheet into opening portions (hollow portions) is suppressed, and it is possible for the flexible wiring board to be a flexible wiring board provided with hollow portions without outflow of adhesive.

The method for producing a flexible wiring board according to the present invention includes a separation step of separating, by cut-shaping in a predetermined shape, a plurality of flexible wiring boards formed linked together by the method for producing a multiple flexible wiring board according to the present invention.

With this configuration, it is possible to form a plurality of (separate) flexible wiring boards in which outflow of adhesive into hollow portions is not present.

The flexible wiring board according to the present invention is produced by the method for producing a flexible wiring board according to the present invention.

With this configuration, it is possible for the flexible wiring board to be a flexible wiring board in which outflow of adhesive into hollow portions is not present.

BRIEF DESCRIPTION OF THE DRAWINGS

FIG. 3(A) shows a layered state in a temporary fastening step prior to thermocompression bonding, and FIG. 3(B) shows a layered state after thermocompression bonding with a pressure bonding step.

FIG. 4 is an exploded perspective view of a multiple flexible wiring board according to Embodiment 2 of the present invention.

FIG. 6(A) shows a layered state in a temporary fastening step prior to thermocompression bonding, and FIG. 6(B) shows a layered state after thermocompression bonding with a pressure bonding step.

FIG. 8 is a plan view of the multiple flexible wiring board according to Embodiment 3 of the present invention.

FIG. 9(A) shows a layered state in a temporary fastening step prior to thermocompression bonding, FIG. 9(B) shows a layered state after thermocompression bonding with a pressure bonding step, and FIG. 9(C) shows separate flexible wiring boards after separation with a separation step.

FIG. 12(A) shows a layered state in a temporary fastening step prior to thermocompression bonding, and FIG. 12(B) shows a layered state after thermocompression bonding with a pressure bonding step.

FIG. 13(A) is a perspective view, FIG. 13(B) is a plan view, FIG. 13(C) is a side view, and FIG. 13(D) is a side view that shows a state of use.

FIG. 16(A) shows a layered state in a temporary fastening step prior to thermocompression bonding, and FIG. 16(B) shows a layered state after thermocompression bonding with a pressure bonding step.

FIG. 17(A) is a plan view, FIG. 17(B) is a side view, and FIG. 17(C) is a side view that shows a state of use.

DESCRIPTION OF THE PREFERRED EMBODIMENTS

Hereinafter, embodiments of the present invention will be described with reference to the accompanying drawings.

Embodiment 1

A multiple flexible wiring board according to Embodiment 1 of the present invention, a method for producing that multiple flexible wiring board, and a flexible wiring board will be described with reference to FIGS. 1 to 3(B).

Figure 1:
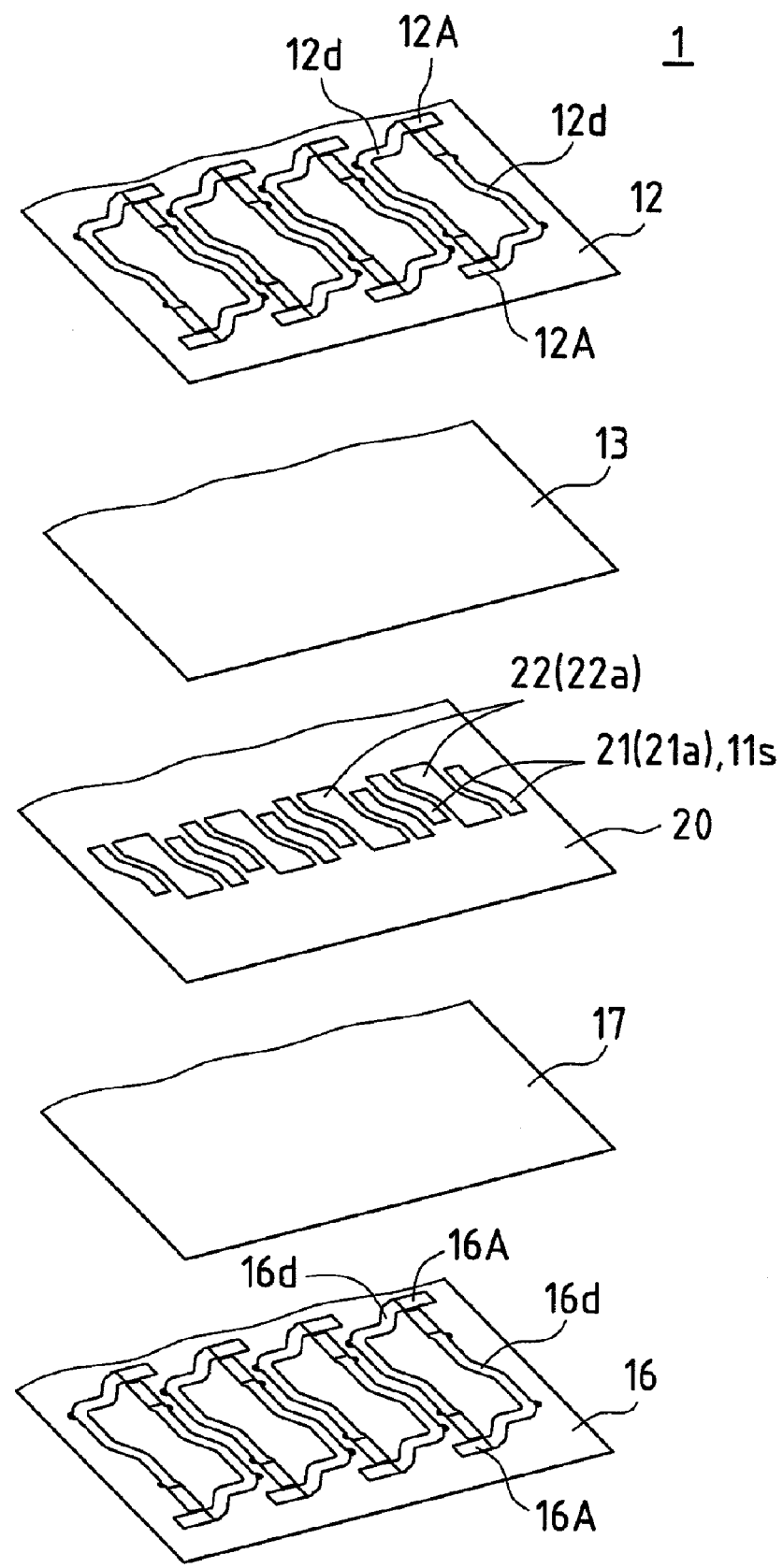
FIG. 1 is an exploded perspective view of a multiple flexible wiring board according to Embodiment 1 of the present invention.
Figure 2:
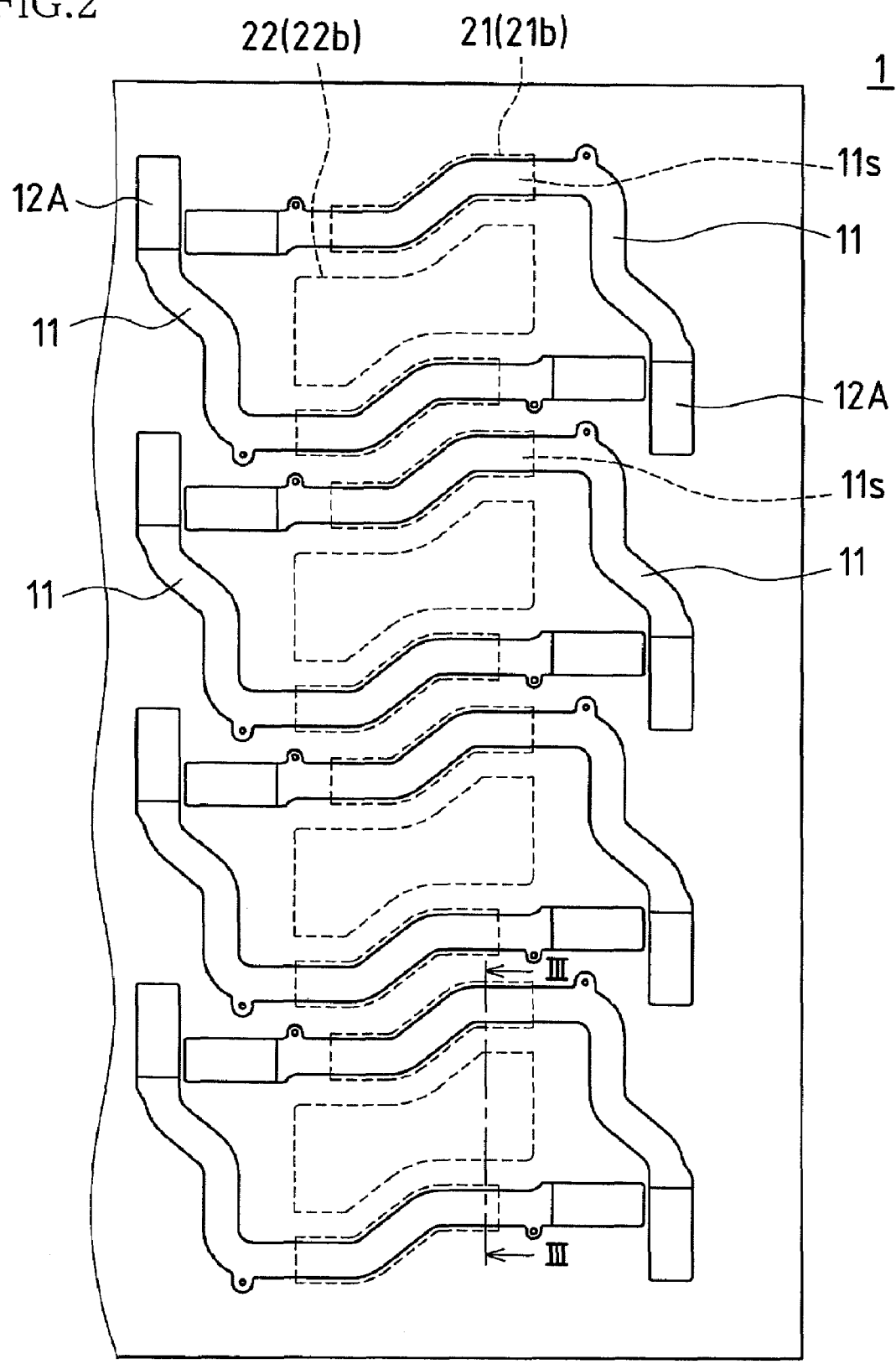
FIG. 2 is a plan view of the multiple flexible wiring board according to Embodiment 1 of the present invention.
Figure 3A:
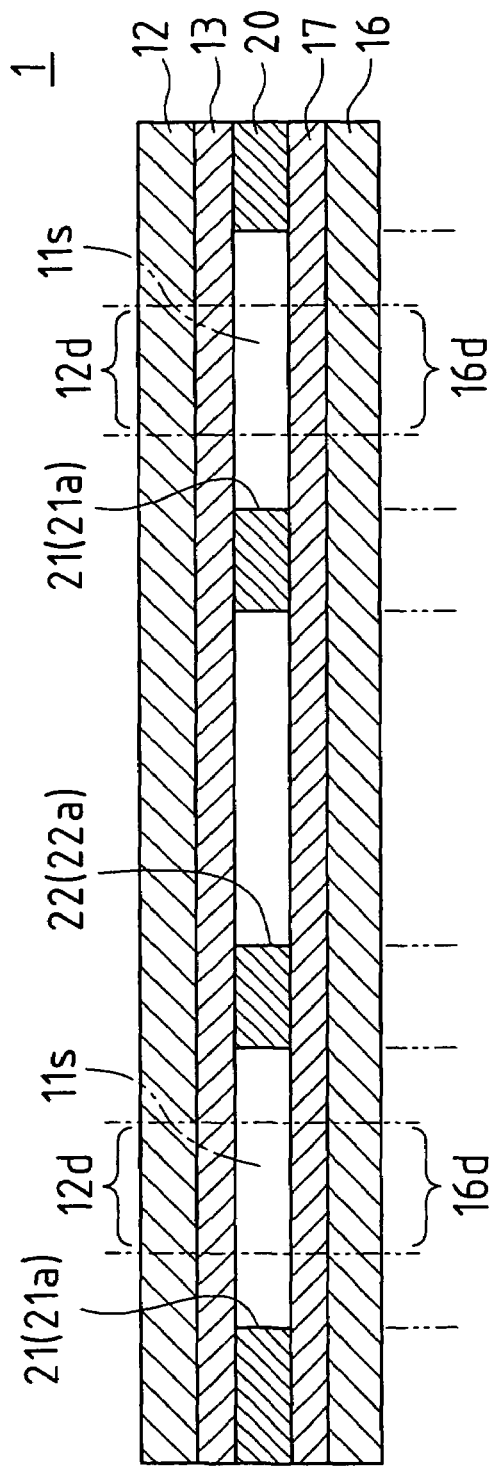
FIGS. 3(A) and 3(B) are cross-sectional diagrams that show the broken cross-section at arrow III in FIG. 2.
Figure 3B:
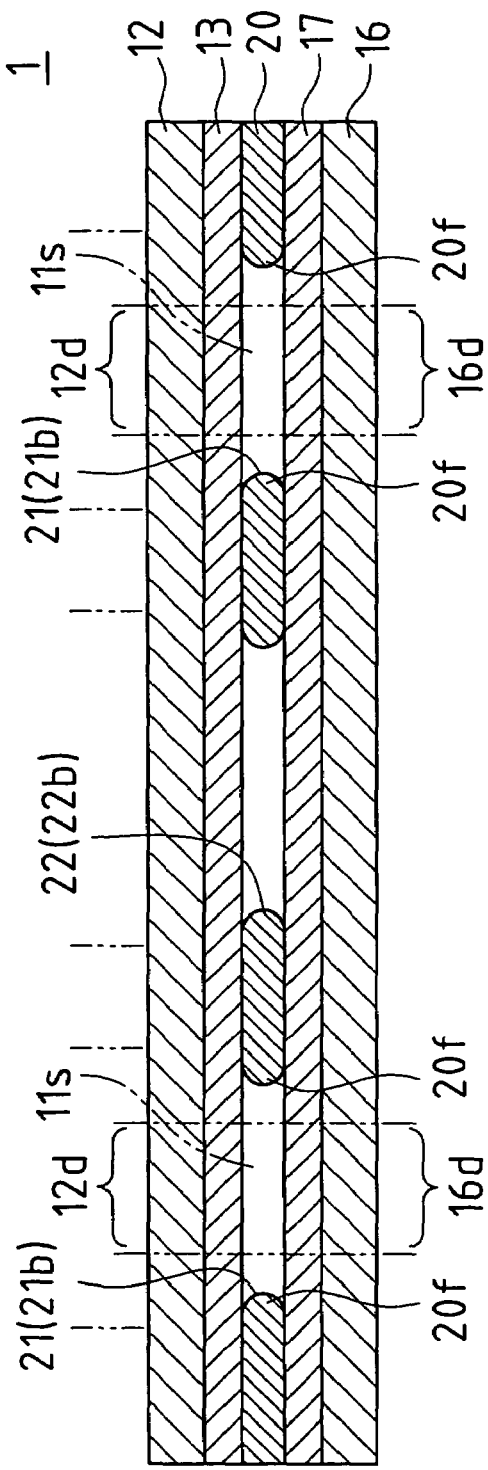

FIG. 1 is an exploded perspective view of a multiple flexible wiring board according to Embodiment 1 of the present invention. FIG. 2 is a plan view of the multiple flexible wiring board according to Embodiment 1 of the present invention. FIGS. 3(A) and 3(B) are cross-sectional diagrams that show the broken cross-section at arrow III in FIG. 2. FIG. 3(A) shows a layered state in a temporary fastening step prior to thermocompression bonding, and FIG. 3(B) shows a layered state after thermocompression bonding with a pressure bonding step.

In a multiple flexible wiring board 1, a plurality of flexible wiring boards 11 are configured by layering, in this arrangement, a first wiring base material 12, a first covering film layer 13 that covers one face of the first wiring base material 12, an adhesive sheet 20 that bonds the first wiring base material 12 and a second wiring base material 16 to each other in a layered state such that they face the first covering film layer 13 and a second covering film layer 17, the second covering film layer 17 that covers one face of the second wiring base material 16, and the second wiring base material 16.

The first wiring base material 12, the first covering film layer 13, the adhesive sheet 20, the second covering film layer 17, and the second wiring base material 16 are temporarily fastened in an aligned and layered state (a temporary fastening step), and with thermocompression bonding that applies heat and pressure from both faces of the first wiring base material 12 and the second wiring base material 16, the first wiring base material 12 and the second wiring base material 16 are bonded with interposition of the adhesive sheet 20 (a pressure bonding step).

The first wiring base material 12 and the second wiring base material 16 each have an insulation layer and a conductor pattern [12A and 16A], and have flexible wiring board corresponding portions 12d and flexible wiring board corresponding portions 16d as areas that correspond to separate flexible wiring boards 11. The insulation layer of the first wiring base material 12 and the second wiring base material 16 has flexibility, and the conductor pattern 12A and 16A respectively, is formed appropriately on one face or both faces of the insulation layer.

A plurality of the flexible wiring board corresponding portions 12d and the flexible wiring board corresponding portions 16d are formed and arranged on the multiple flexible wiring board 1, and it is possible to form a large number of flexible wiring boards 11 in a single processing step. Here, a state is shown in which by arranging two flexible wiring board corresponding portions 12d (the flexible wiring board corresponding portions 16d) in a plane such that they are symmetrically opposed, the area usage ratio is improved, and by further arranging the flexible wiring board corresponding portions 12d (the flexible wiring board corresponding portions 16d) in four rows, a total of eight flexible wiring boards 11 are formed together.

In the adhesive sheet 20, an opening portion 21 (for the convenience of this description, the opening portion prior to thermocompression bonding may be indicated as an opening portion 21a, and the opening portion after thermocompression bonding may be indicated as an opening portion 21b) is formed in order to form a hollow portion 11s after layering (an opening portion formation step). Excess adhesive of the adhesive sheet 20 is melted due to the application of heat and pressure by the thermocompression bonding step and flows into the opening portion 21, forming an adhesive outflow portion 20f. Accordingly, the opening portion 21b is influenced by the adhesive outflow portion 20f and thus is smaller than the opening portion 21a.

However, in the present embodiment, auxiliary opening portions 22 (for the convenience of this description, an auxiliary opening portion 22 prior to thermocompression bonding may be indicated as an auxiliary opening portion 22a, and an auxiliary opening portion 22 after thermocompression bonding may be indicated as an auxiliary opening portion 21b) are formed alongside opening portions 21 at positions that correspond to the intervals between adjacent flexible wiring boards 11 (the interval between two flexible wiring board corresponding portions 12d in the first wiring base material 12, or the interval between two flexible wiring board corresponding portions 16d in the second wiring base material 16) (an auxiliary opening portion formation step). Thus, excess adhesive is dispersed (contained) by the auxiliary opening portions 22, so it is possible to suppress (control) adhesive outflow portions 20f formed by outflow of adhesive from the adhesive sheet 20 into the opening portion 21. Therefore, outflow of adhesive into an area that corresponds to the hollow portion 11s of a flexible wiring board 11 does not occur.

That is, provided in the present embodiment are, before the temporary fastening step (before layering), an opening portion formation step in which a plurality of the opening portions 21 are formed in the adhesive sheet 20 such that they correspond to each of the plurality of flexible wiring boards 11 in order to form the hollow portion 11s of each of the plurality of flexible wiring boards 11 between the first wiring base material 12 (the flexible wiring board corresponding portions 12d) and the second wiring base material 16 (the flexible wiring board corresponding portions 16d), and an auxiliary opening portion formation step in which auxiliary opening portions 22 are formed between adjacent flexible wiring boards 11, alongside the opening portions 21.

Also, in the present embodiment, because the auxiliary opening portions 22 are formed in the adhesive sheet 20, the opening portions 21 and the auxiliary opening portions 22 can be formed at the same time by making the opening portion formation step and the auxiliary opening portion formation step to be the same step.

After thermocompression bonding, the multiple flexible wiring board 1 is separated (a separation step) by pressing (cut-shaping) with a metal die of a predetermined shape that corresponds to the flexible wiring boards 11, thus forming a plurality of the separate flexible wiring boards 11 (see FIG. 13) at the same time.

Because adhesive is not present in the hollow portion 11s, the separate flexible wiring boards 11 are in a completely hollow state, and flexibility from the first wiring base material 12 and the second wiring base material 16 can be reliably maintained, so the flexible wiring boards have excellent bendability and high reliability (see FIG. 13).

Embodiment 2

A multiple flexible wiring board according to Embodiment 2 of the present invention, a method for producing that multiple flexible wiring board, and a flexible wiring board will be described with reference to FIGS. 4 to 6(B).

Figure 5:
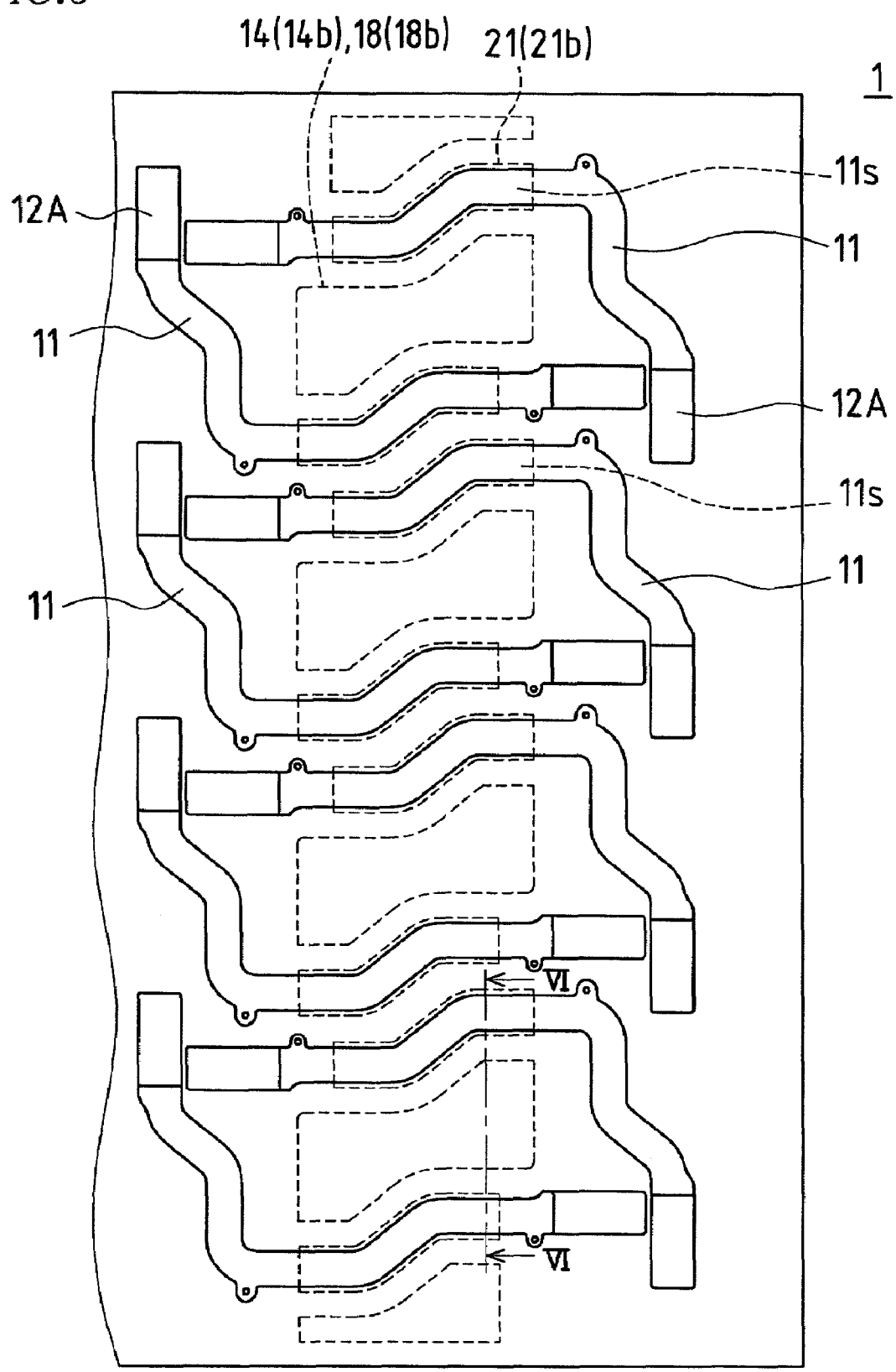
FIG. 5 is a plan view of the multiple flexible wiring board according to Embodiment 2 of the present invention.
Figure 6A:
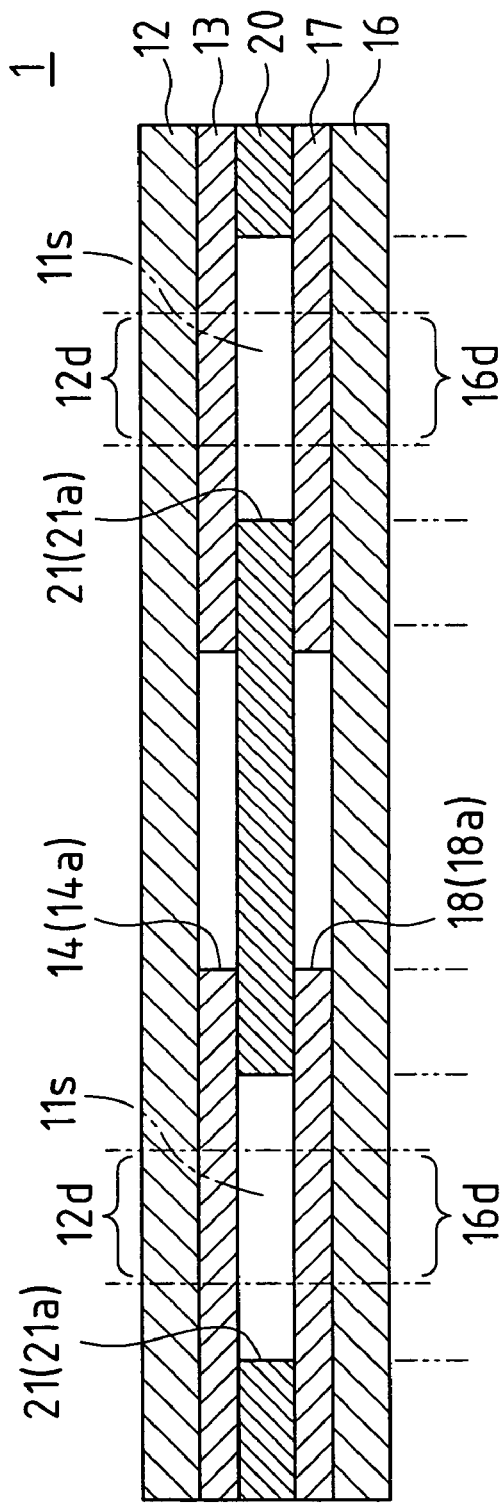
FIGS. 6(A) and 6(B) are cross-sectional diagrams that show the broken cross-section at arrow VI in FIG. 5.
Figure 6B:
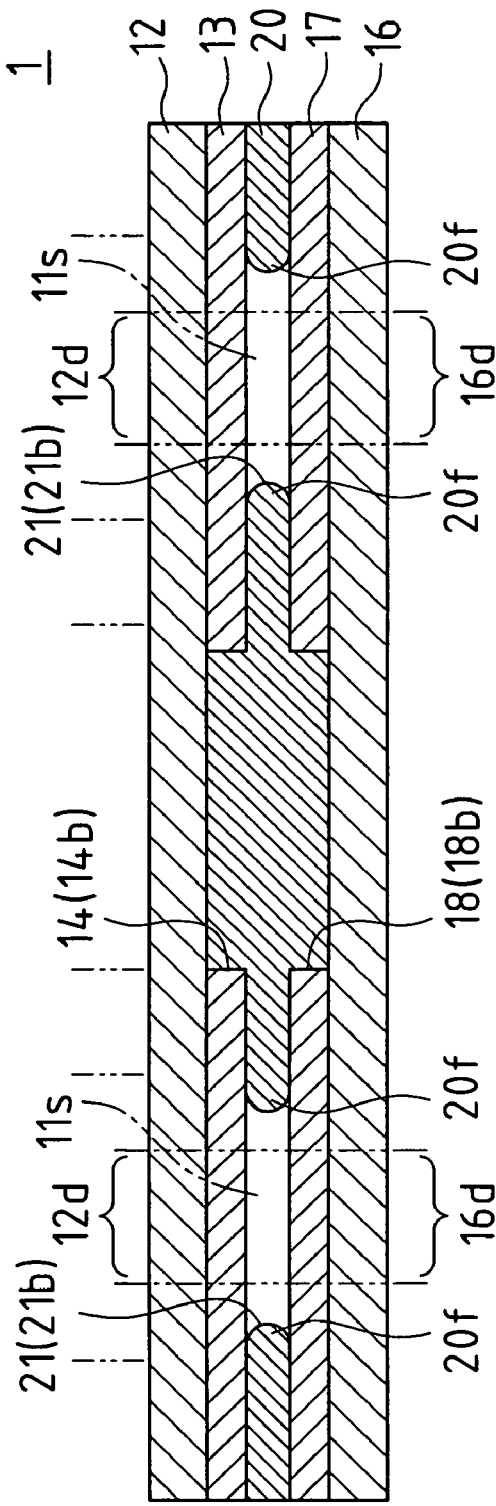

FIG. 4 is an exploded perspective view of a multiple flexible wiring board according to Embodiment 2 of the present invention. FIG. 5 is a plan view of the multiple flexible wiring board according to Embodiment 2 of the present invention. FIGS. 6(A) and 6(B) are cross-sectional diagrams that show the broken cross-section at arrow VI in FIG. 5. FIG. 6(A) shows a layered state in a temporary fastening step prior to thermocompression bonding, and FIG. 6(B) shows a layered state after thermocompression bonding with a pressure bonding step.

The present embodiment is basically the same as Embodiment 1. The same reference numerals are given to the same configurations, and a detailed description thereof is omitted.

In the present embodiment, auxiliary opening portions 14 (for the convenience of this description, an auxiliary opening portion 14 prior to thermocompression bonding may be indicated as an auxiliary opening portion 14a, and an auxiliary opening portion 14 after thermocompression bonding may be indicated as an auxiliary opening portion 14b) are formed in the first covering film layer 13 (auxiliary opening portion formation step). Likewise, auxiliary opening portions 18 (for the convenience of this description, an auxiliary opening portion 18 prior to thermocompression bonding may be indicated as an auxiliary opening portion 18a, and an auxiliary opening portion 18 after thermocompression bonding may be indicated as an auxiliary opening portion 18b) are formed in the second covering film layer 17 (auxiliary opening portion formation step).

The auxiliary opening portions 14 and the auxiliary opening portions 18 are formed alongside the opening portions 21 at positions that correspond to the intervals between adjacent flexible wiring boards 11 (the interval between two flexible wiring board corresponding portions 12d in the first wiring base material 12, or the interval between two flexible wiring board corresponding portions 16d in the second wiring base material 16). Thus, excess adhesive is dispersed (contained) by the auxiliary opening portions 14 (14b) and the auxiliary opening portions 18 (18b), so it is possible to suppress adhesive outflow portions 20f formed by outflow of adhesive from the adhesive sheet 20 into the opening portion 21. Therefore, outflow of adhesive into an area that corresponds to the hollow portion 11s of a flexible wiring board 11 does not occur.

That is, in the present embodiment, in the auxiliary opening portion formation step, between adjacent flexible wiring boards 11 and alongside the opening portions 21, auxiliary opening portions 14 are formed in the first covering film layer 13, and auxiliary opening portions 18 are formed in the second covering film layer 17. It is sufficient that the auxiliary opening portions 14 (14a) and the auxiliary opening portions 18 (18a) have a capacity that can contain excess adhesive, and when the adhesive has low viscosity, if the auxiliary opening portions 14 (14a) and the auxiliary opening portions 18 (18a) are formed in at least either one of the first covering film layer 13 and the second covering film layer 17, the effect will be exhibited.

Accordingly, with the present embodiment it is possible to exhibit the same operational effect as in Embodiment 1.

Embodiment 3

A multiple flexible wiring board according to Embodiment 3 of the present invention, a method for producing that multiple flexible wiring board, and a flexible wiring board will be described with reference to FIGS. 7 to 9(C).

Figure 7:
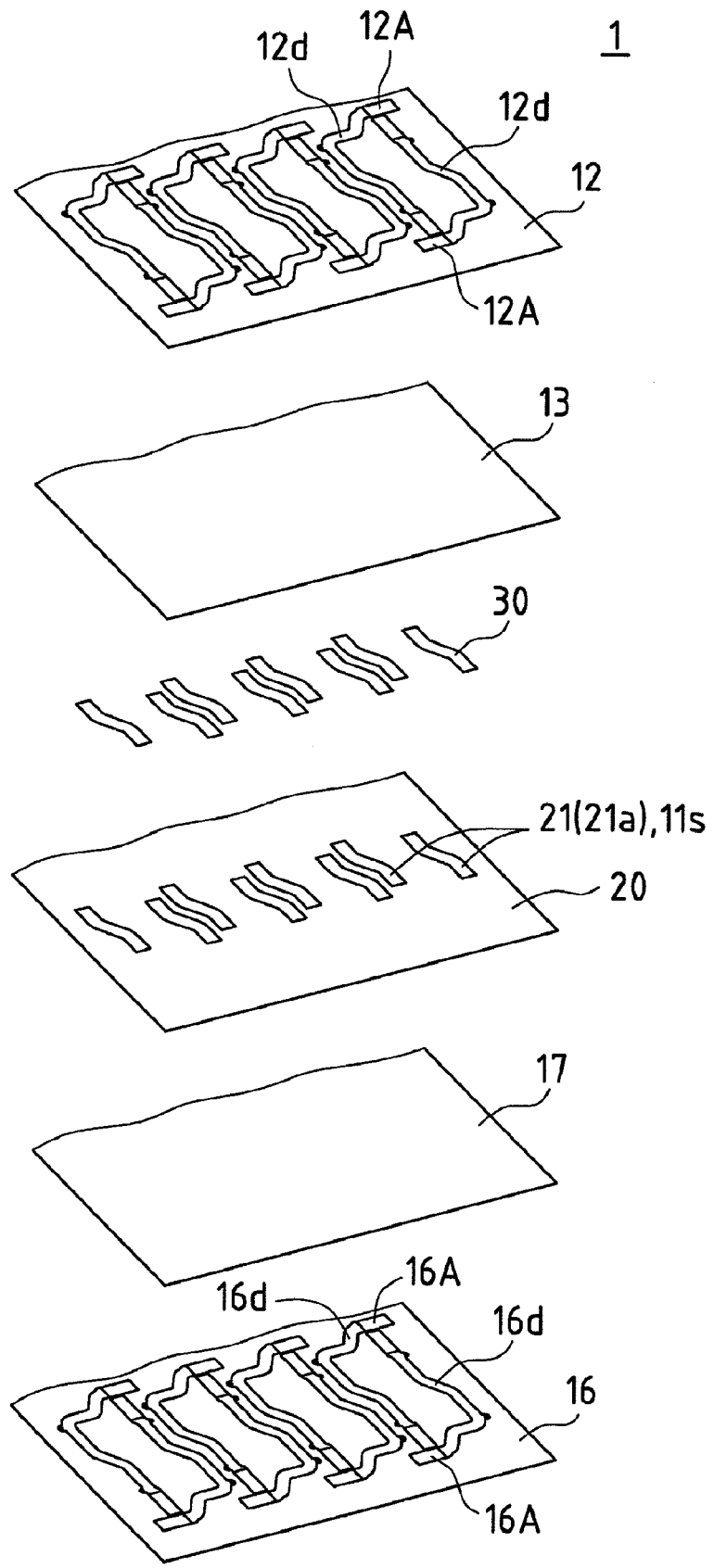
FIG. 7 is an exploded perspective view of a multiple flexible wiring board according to Embodiment 3 of the present invention.
Figure 9A:
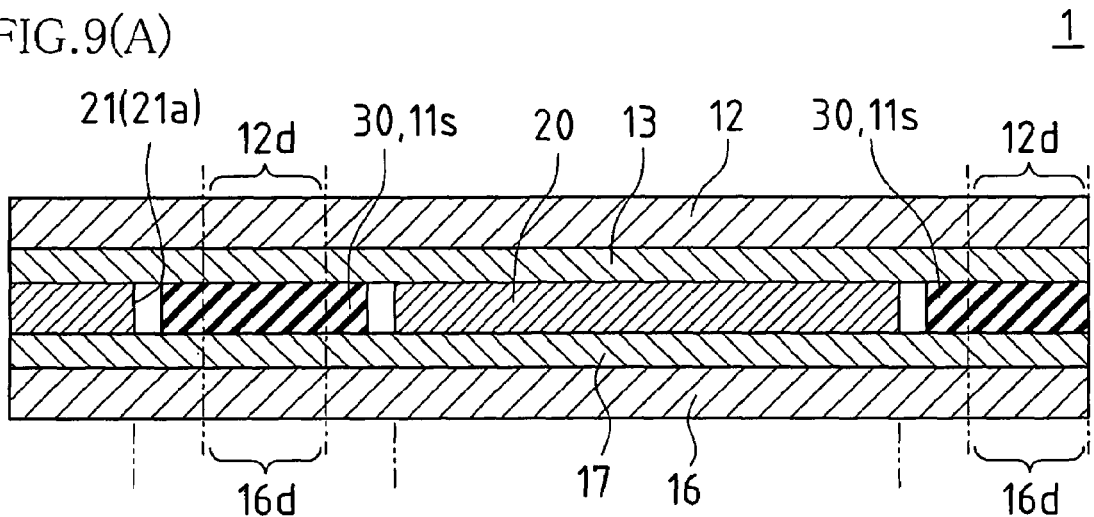
FIGS. 9(A) to 9(C) are cross-sectional diagrams that show the broken cross-section at arrow IX in FIG. 8.
Figure 9B:
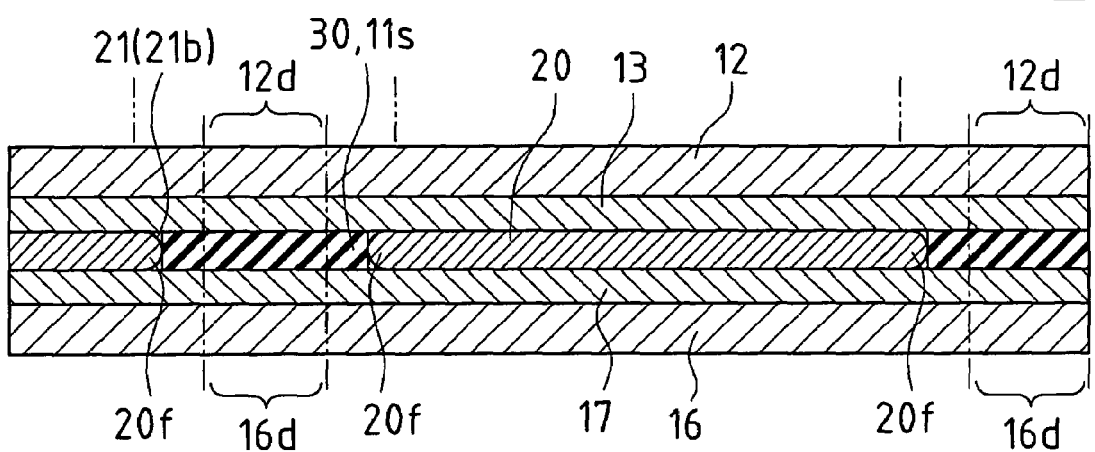
Figure 9C:
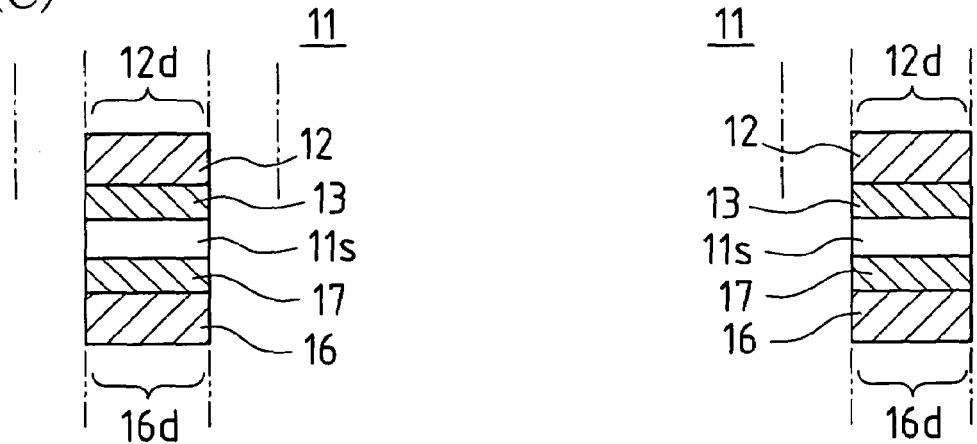

FIG. 7 is an exploded perspective view of a multiple flexible wiring board according to Embodiment 3 of the present invention. FIG. 8 is a plan view of the multiple flexible wiring board according to Embodiment 3 of the present invention. FIGS. 9(A) to 9(C) are cross-sectional diagrams that show the broken cross-section at arrow IX in FIG. 8. FIG. 9(A) shows a layered state in a temporary fastening step prior to thermocompression bonding, FIG. 9(B) shows a layered state after thermocompression bonding with a pressure bonding step, and FIG. 9(C) shows separate flexible wiring boards after separation with a separation step.

The present embodiment is basically the same as Embodiment 1 and Embodiment 2. The same reference numerals are given to the same configurations, and a detailed description thereof is omitted.

In the present embodiment, instead of the auxiliary opening portion formation step in which auxiliary opening portions 22 were formed in Embodiment 1, and in which auxiliary opening portions 14 and auxiliary opening portions 18 were formed in Embodiment 2, an embedding step is provided in which spacers 30 are embedded in the opening portions 21. Because the opening portions 21 are embedded with the spacers 30, excess adhesive from the adhesive sheet 20 is suppressed with the spacers 30, and adhesive outflow portions 20f can be suppressed, so outflow of adhesive into an area that corresponds to the hollow portion 11s of a flexible wiring board 11 does not occur.

The spacers 30 can be appropriately removed from the side face of the flexible wiring boards 11 that were cut and separated in the separation step after thermocompression bonding. FIG. 9(C) shows a state after the spacers 30 have been removed.

Accordingly, with the present embodiment it is possible to exhibit the same operational effect as in Embodiment 1.

Embodiment 4

A multiple flexible wiring board according to Embodiment 4 of the present invention, a method for producing that multiple flexible wiring board, and a flexible wiring board will be described with reference to FIGS. 10 to 12(B).

Figure 10:
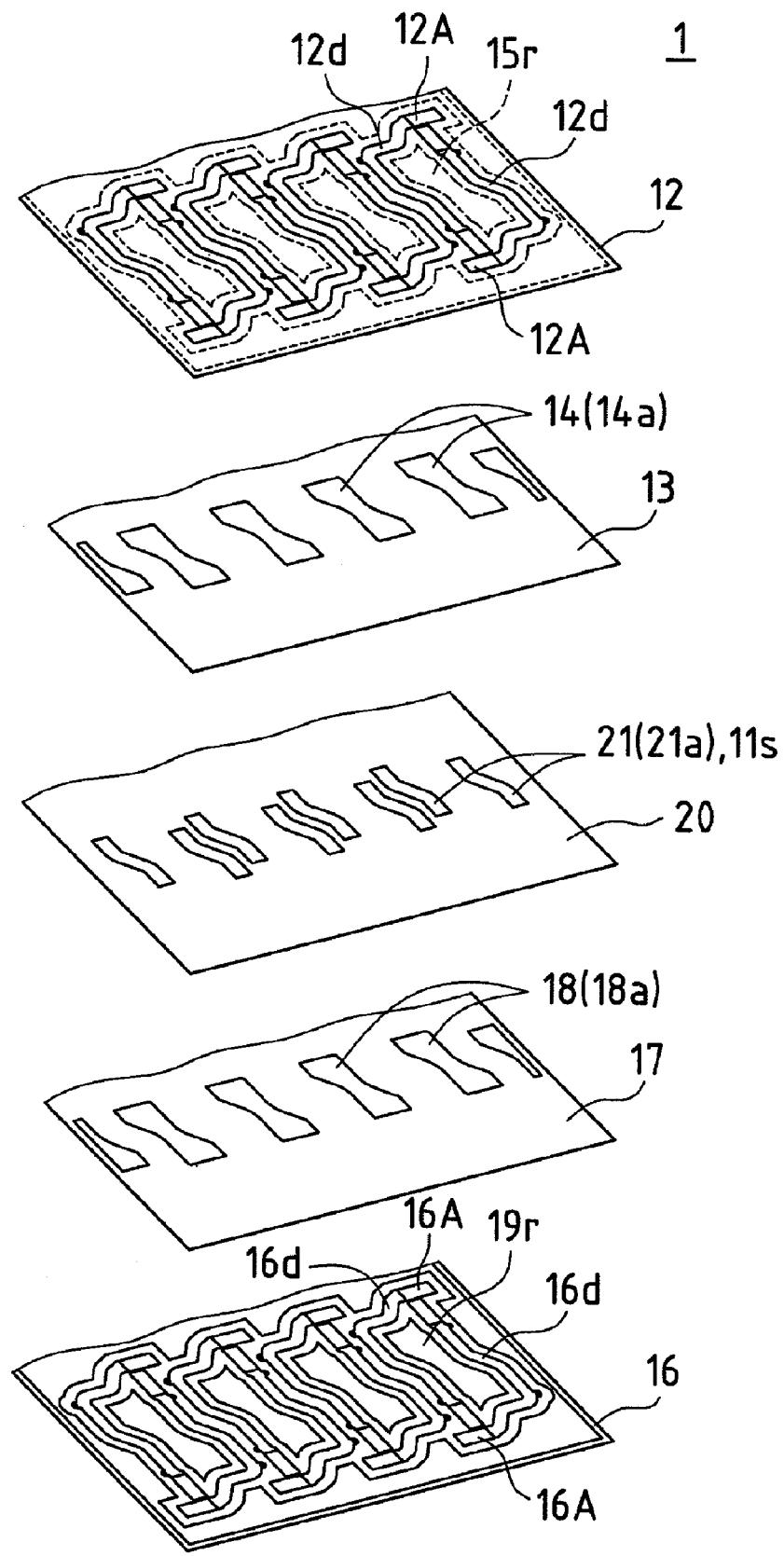
FIG. 10 is an exploded perspective view of a multiple flexible wiring board according to Embodiment 4 of the present invention.
Figure 11:
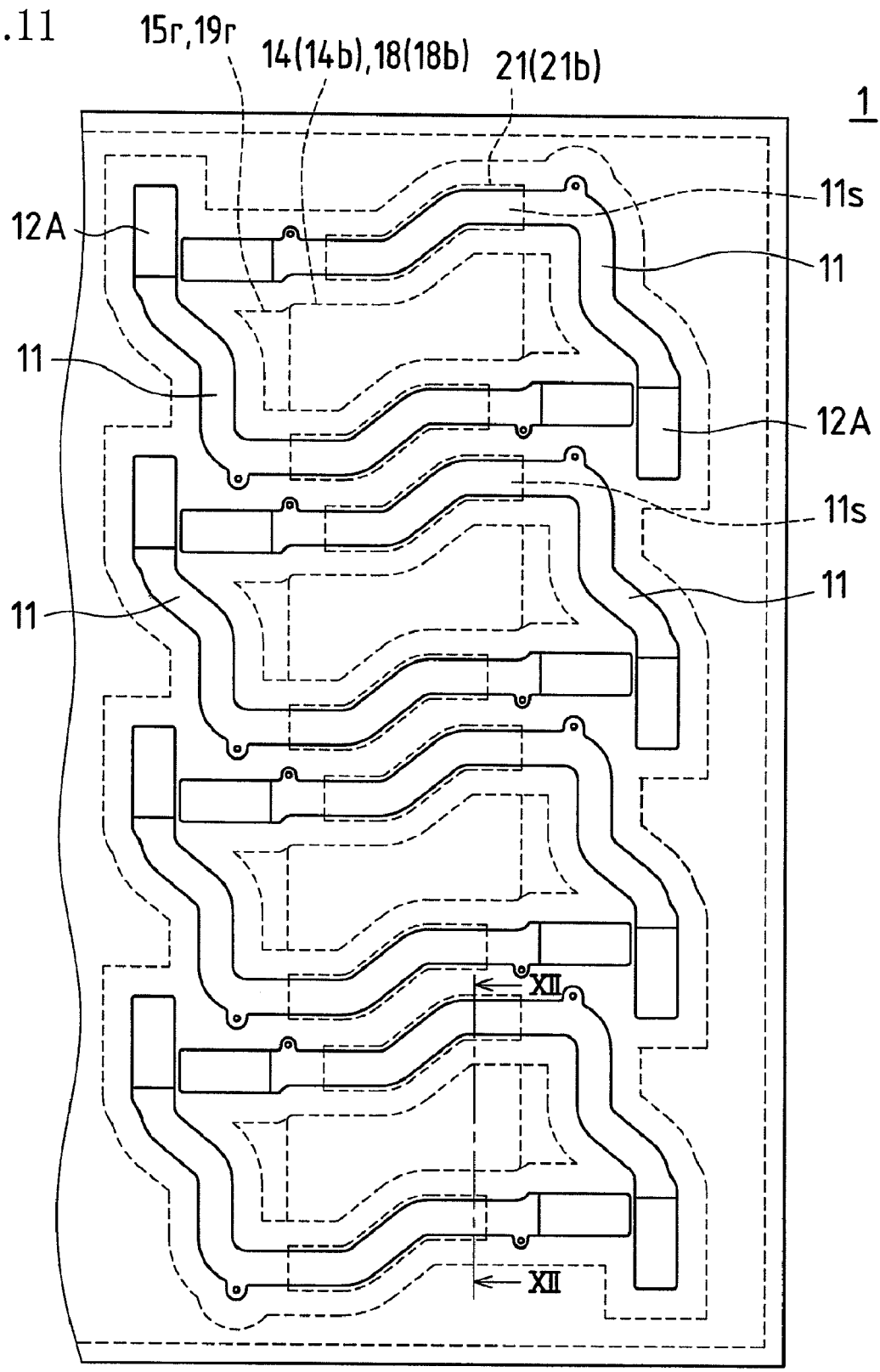
FIG. 11 is a plan view of the multiple flexible wiring board according to Embodiment 4 of the present invention.
Figure 12A:
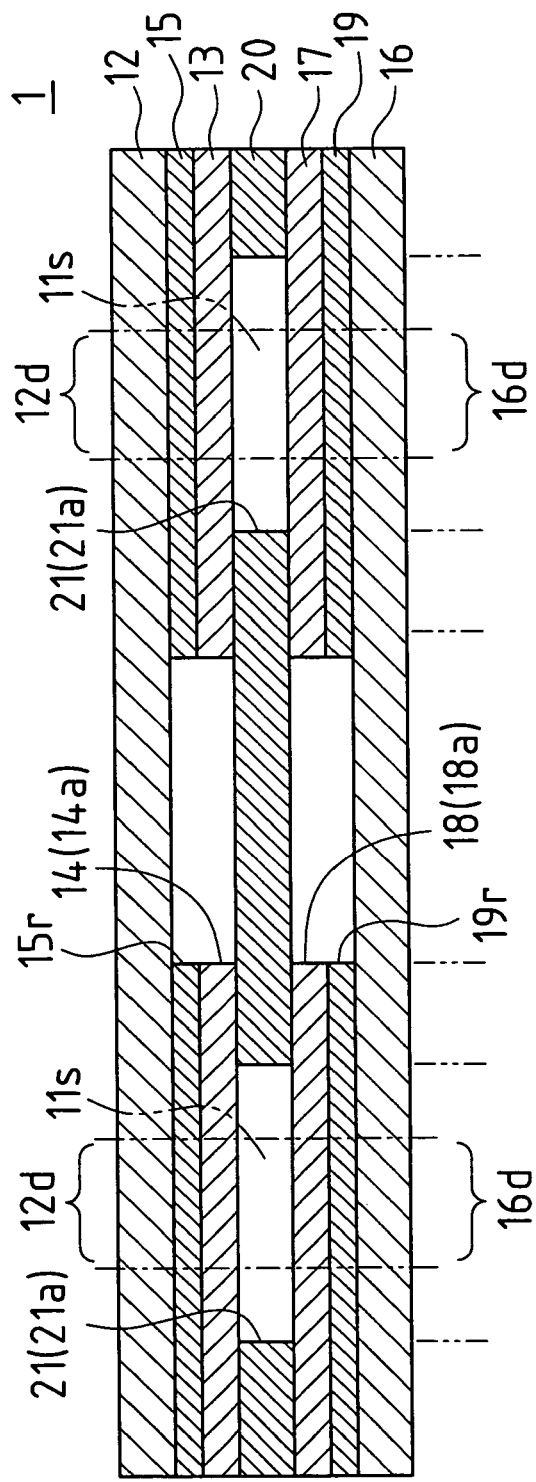
FIGS. 12(A) and 12(B) are cross-sectional diagrams that show the broken cross-section at arrow XII in FIG. 11.
Figure 12B:
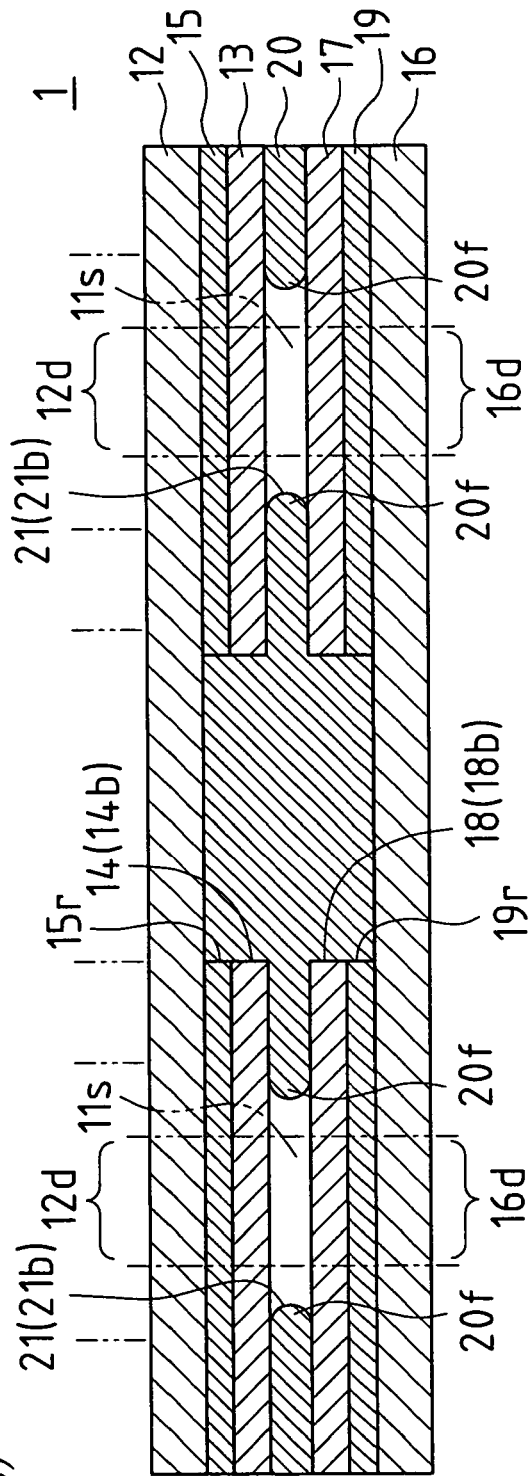

FIG. 10 is an exploded perspective view of a multiple flexible wiring board according to Embodiment 4 of the present invention. FIG. 11 is a plan view of the multiple flexible wiring board according to Embodiment 4 of the present invention. FIGS. 12(A) and 12(B) are cross-sectional diagrams that show the broken cross-section at arrow XII in FIG. 11. FIG. 12(A) shows a layered state in a temporary fastening step prior to thermocompression bonding, and FIG. 12(B) shows a layered state after thermocompression bonding with a pressure bonding step.

The present embodiment is basically the same as Embodiment 2. The same reference numerals are given to the same configurations, and a detailed description thereof is omitted.

In the present embodiment, conductor layer removal portions 15r are formed by removing a conductor layer 15 that corresponds to a conductor pattern [12A] formed layered on the first covering film layer 13 side (adhesive sheet 20 side) of the first wiring base material 12 at positions that correspond to auxiliary opening portions (for example, the auxiliary opening portions 14). Also, conductor layer removal portions 19r are formed by removing a conductor layer 19 that corresponds to a conductor pattern [16A] formed layered on the second covering film layer 17 side (adhesive sheet 20 side) of the second wiring base material 16 at positions that correspond to auxiliary opening portions (for example, the auxiliary opening portions 18). It is not necessary for the shape of the conductor layer removal portions 15r relative to the auxiliary opening portions 14 and the shape of the conductor layer removal portions 19r relative to the auxiliary opening portions 18 to be the same, but it is preferable that their shapes are similar.

By using the conductor layer removal portions 15r and the conductor layer removal portions 19r along with the auxiliary opening portions 14 and 18 in Embodiment 2, it is possible to contain excess adhesive that corresponds to the thickness of the conductor layer, and so it is possible to more reliably suppress outflow of adhesive from the adhesive sheet 20 into the opening portion 21. Also, it is sufficient that the conductor layer removal portions 15r and the conductor layer removal portions 19r have a capacity that can contain excess adhesive, and when the adhesive has low viscosity, if the conductor layer removal portions 15r and the conductor layer removal portions 19r are formed in at least either one of the conductor layer 15 and the conductor layer 19, the effect will be exhibited.

Embodiment 5

Figure 13A:
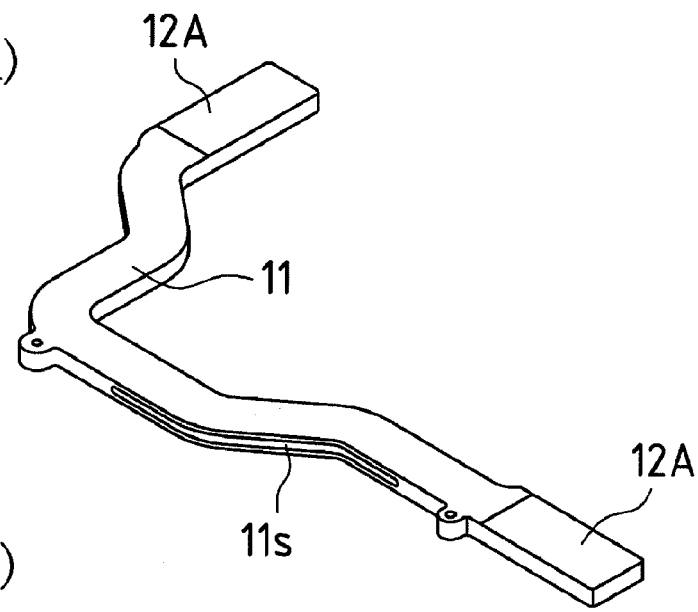
FIGS. 13(A) to 13(D) are explanatory diagrams that explain a flexible wiring board according to Embodiment 5 of the present invention.
Figure 13B:
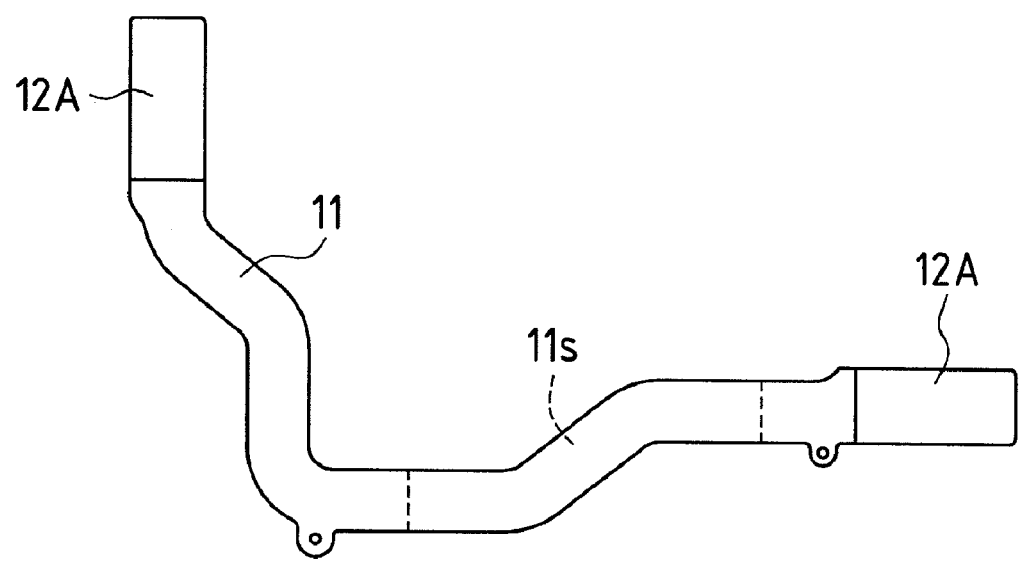
Figure 13C:
Figure 13D:
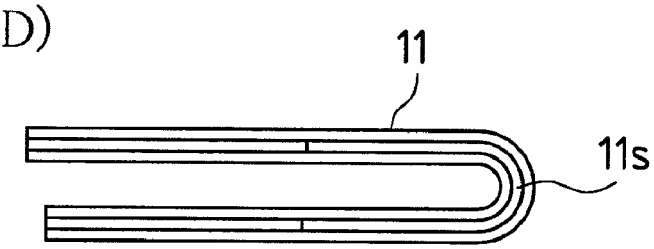
Figure 14:
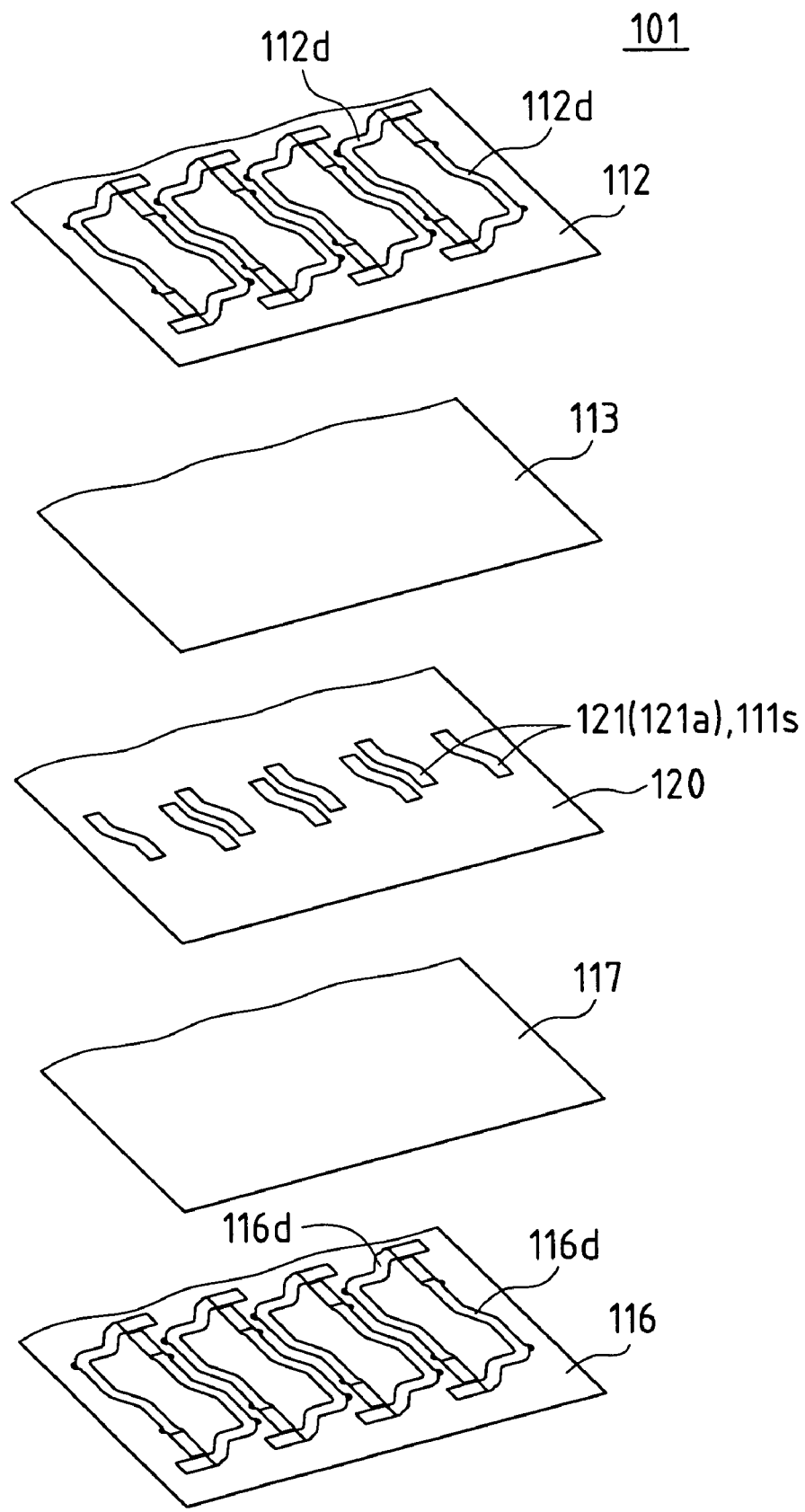
FIG. 14 is an exploded perspective view of a multiple flexible wiring board according to a conventional example.
Figure 15:
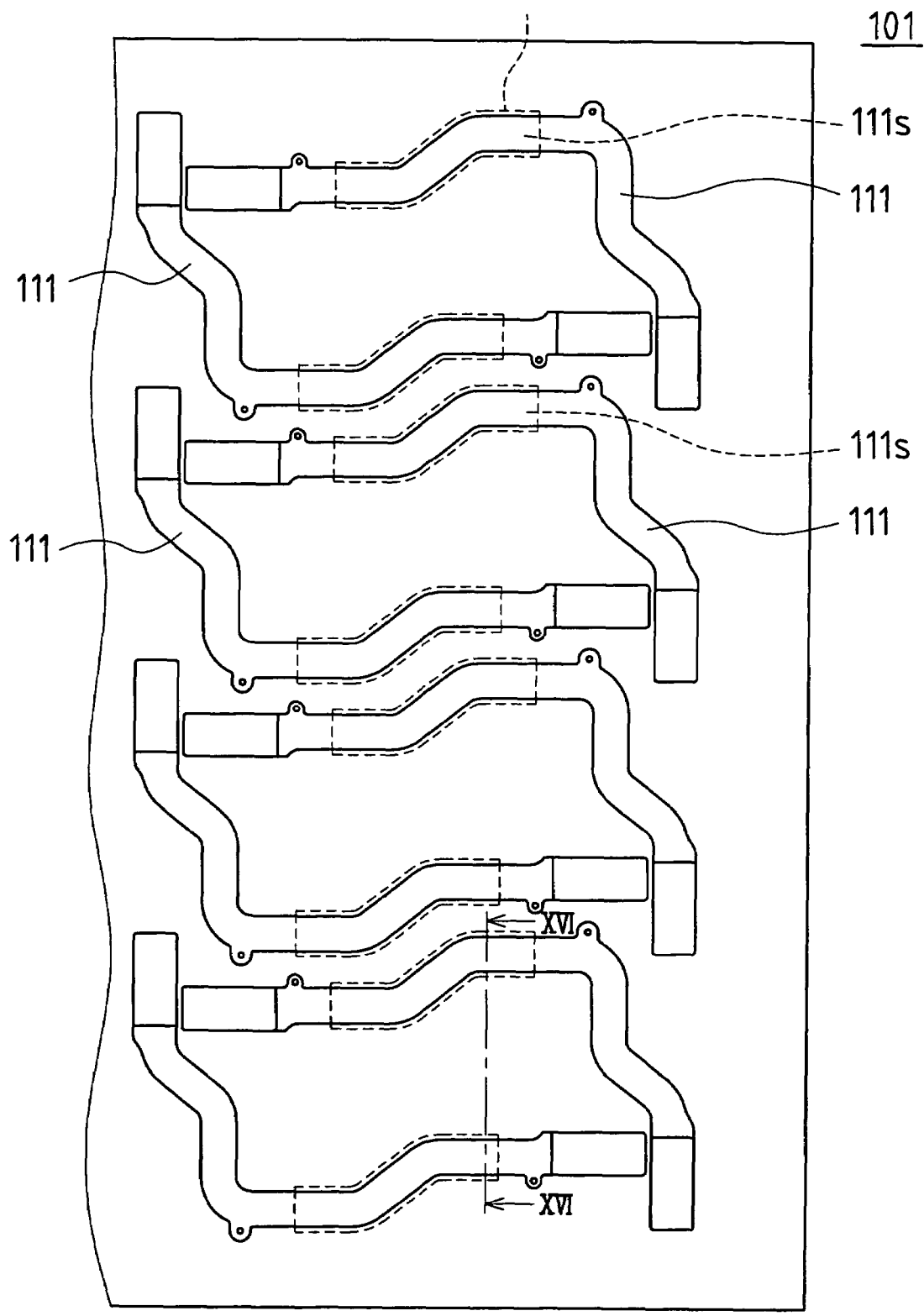
FIG. 15 is a plan view of the multiple flexible wiring board according to the conventional example.
Figure 16A:
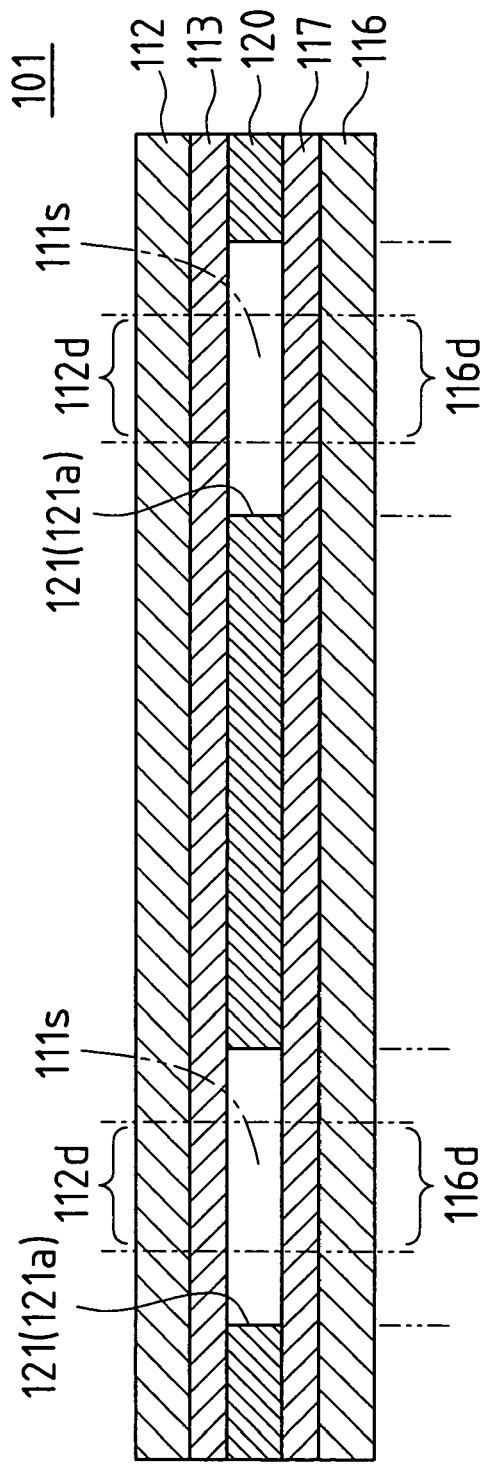
FIGS. 16(A) and 16(B) are cross-sectional diagrams that show the broken cross-section at arrow XVI in FIG. 15.
Figure 16B:
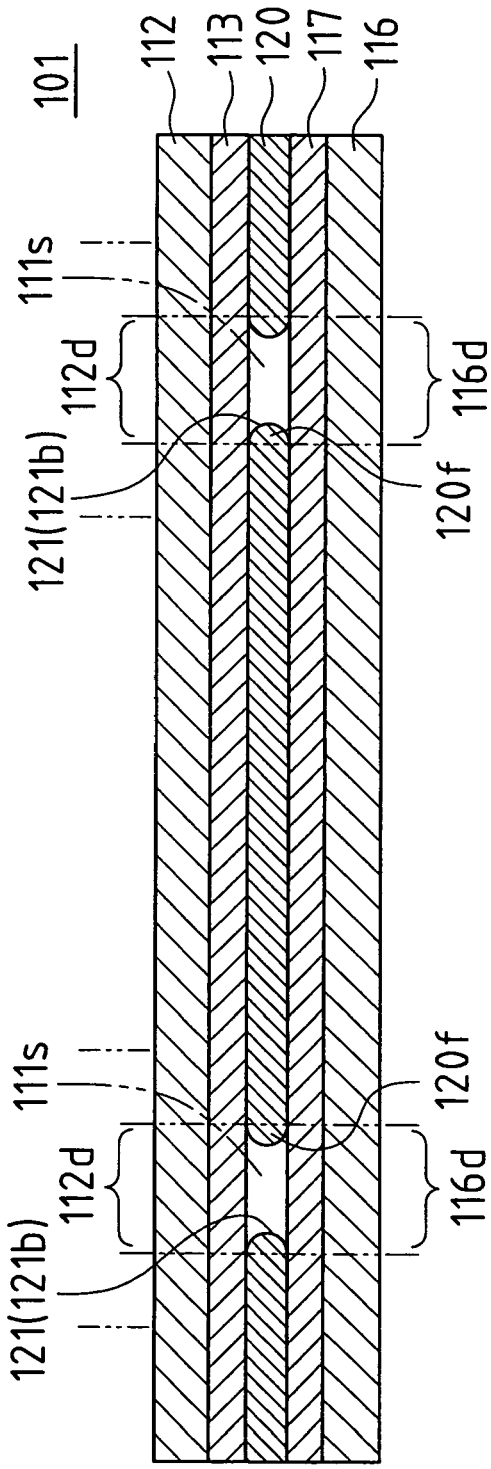
Figure 17A:
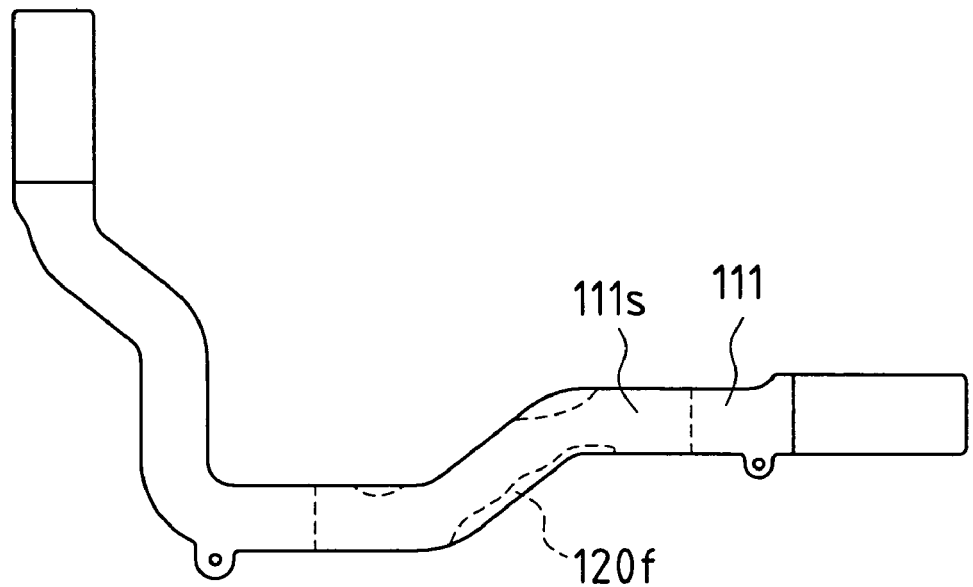
FIGS. 17(A) to 17(C) are explanatory diagrams that explain a flexible wiring board according to the conventional example.
Figure 17B:
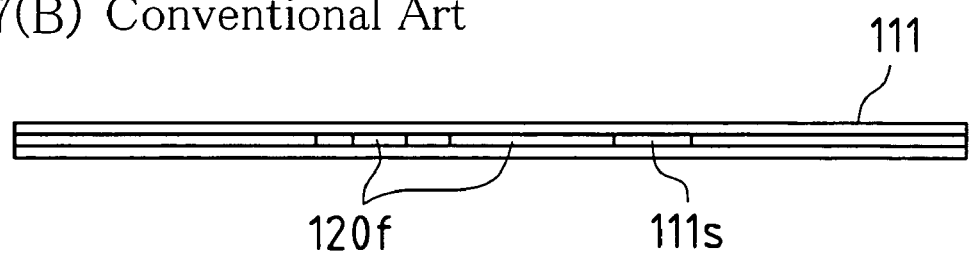
Figure 17C:
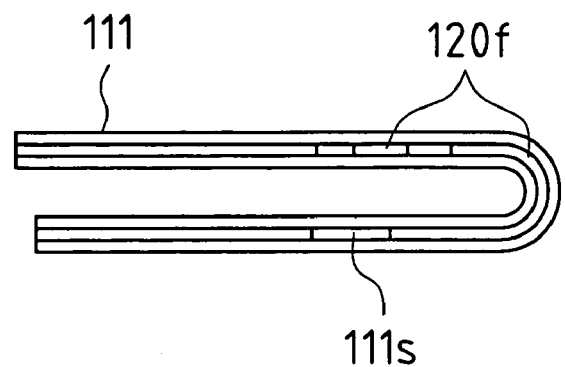

FIGS. 13(A) to 13(D) are explanatory diagrams that explain a flexible wiring board according to Embodiment 5 of the present invention. FIG. 13(A) is a perspective view, FIG. 13(B) is a plan view, FIG. 13(C) is a side view, and FIG. 13(D) is a side view that shows a state of use.

In the present embodiment, after thermocompression bonding, the multiple flexible wiring board 1 (see Embodiments 1 to 4) is separated (a separation step) by pressing (cut-shaping) with a metal die of a predetermined shape that corresponds to the flexible wiring boards 11, thus forming a plurality of the flexible wiring boards 11 at the same time.

Because adhesive is not present in the hollow portion 11s, the separate flexible wiring boards 11 are in a completely hollow state, and flexibility can be reliably maintained, so as shown in FIG. 13(D), the flexible wiring boards 11 have excellent bendability and high reliability.

The present invention may be embodied in various other forms without departing from the gist or essential characteristics thereof. The embodiments disclosed in this application are to be considered in all respects as illustrative and not limiting. The scope of the invention is indicated by the appended claims rather than by the foregoing description, and all modifications or changes that come within the meaning and range of equivalency of the claims are intended to be embraced therein.

What is claimed is:

1. A multiple flexible wiring board in which a plurality of flexible wiring boards are configured, the multiple flexible wiring board comprising:
   a first wiring base material having an insulation layer and a conductor pattern,
   a first covering film layer that covers one face of the first wiring base material,
   a second wiring base material having an insulation layer and a conductor pattern,
   a second covering film layer that covers one face of the second wiring base material, and
   an adhesive sheet that bonds the first wiring base material and the second wiring base material in a layered state such that the first covering film layer and the second covering film layer are opposed, and has opening portions that have been formed corresponding to each of the plurality of flexible wiring boards, wherein
   a hollow portion for each of the plurality of flexible wiring boards is formed between the first wiring base material and the second wiring base material by the opening portions, and
   auxiliary opening portions are formed between the flexible wiring boards alongside the opening portions, wherein said auxiliary opening portions have borders that are within the innermost surfaces of the insulation layers of the respective first and second wiring base materials.

2. The multiple flexible wiring board according to claim 1, wherein the auxiliary opening portions are formed in the adhesive sheet.

3. The multiple flexible wiring board according to claim 1, wherein the auxiliary opening portions are formed in at least either one of the first covering film layer and the second covering film layer.

4. The multiple flexible wiring board according to claim 3, wherein at least either one of a conductor layer that corresponds to the conductor pattern of the first wiring base material and a conductor layer that corresponds to the conductor pattern of the second wiring base material that are each formed on the side of the adhesive sheet is removed at positions that correspond to the auxiliary opening portions.

* * * * *